US011178749B2

(12) United States Patent
Zeng (10) Patent No.: US 11,178,749 B2
(45) Date of Patent: Nov. 16, 2021

(54) PRINTED CIRCUIT BOARD ASSEMBLY AND ELECTRONIC APPARATUS USING THE SAME

(71) Applicant: ALi Corporation, Hsinchu (TW)

(72) Inventor: Liang-Cai Zeng, Guangdong (CN)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 17/149,685

(22) Filed: Jan. 14, 2021

(65) Prior Publication Data

US 2021/0315092 A1 Oct. 7, 2021

(30) Foreign Application Priority Data

Apr. 3, 2020 (CN) .......................... 202010260730.0

(51) Int. Cl.
H05K 1/00 (2006.01)
H05K 1/02 (2006.01)
H05K 9/00 (2006.01)

(52) U.S. Cl.
CPC ........... H05K 1/023 (2013.01); H05K 1/0219 (2013.01); H05K 9/0024 (2013.01); *H05K 2201/10371* (2013.01)

(58) Field of Classification Search
CPC .... H05K 1/023; H05K 1/0219; H05K 9/0024; H05K 2201/10371

USPC .......................................................... 361/748
See application file for complete search history.

(56) References Cited

U.S. PATENT DOCUMENTS

2007/0081309 A1* 4/2007 Urushibara ............ H05K 1/189
361/748
2007/0138602 A1* 6/2007 Orth ...................... H05K 7/1462
257/659

* cited by examiner

*Primary Examiner* — Andargie M Aychillhum
(74) *Attorney, Agent, or Firm* — Li & Cai Intellectual Property Office (57) ABSTRACT

A printed circuit board assembly and an electronic apparatus using the same are provided. The printed circuit board assembly includes a circuit board and a first bridging unit. The circuit board includes a first wiring layer, and the first wiring layer includes a plurality of first ground traces, a plurality of first signal traces, and at least one first ground region. Each of the first signal traces is disposed between one of the first ground traces and the first ground region. The first bridging unit is disposed on the first wiring layer of the circuit board. The first bridging unit extends over, without contacting, at least one of the first signal traces from one of the first ground traces to another one of the first ground traces or the first ground region, so as to form at least one first conductive ground path.

15 Claims, 7 Drawing Sheets

PRINTED CIRCUIT BOARD ASSEMBLY AND ELECTRONIC APPARATUS USING THE SAME

CROSS-REFERENCE TO RELATED PATENT APPLICATION

This application claims the benefit of priority to China Patent Application No. 202010260730.0, filed on Apr. 3, 2020 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a printed circuit board assembly and an electronic apparatus using the same, and more particularly to a printed circuit board capable of transmitting signals with high speed and an electronic apparatus using the same.

BACKGROUND OF THE DISCLOSURE

In a conventional electronic apparatus, a packaged integrated circuit component (such as a system level integration chip) is disposed on a circuit board and electrically connected to other electronic devices, such as a memory. In conventional technology, the circuit board usually includes an insulating board, two wiring layers respectively disposed at two opposite surfaces of the insulating board, and a plurality of conductive vias for establishing electrical connections between the two wiring layers.

Each of the wiring layers includes a plurality of signal traces and a plurality of ground traces, so as to transmit signals between the packaged integrated circuit component and the other electronic devices. However, the crosstalk among the signals transmitted by the signal and ground traces may be caused by effects such as electromagnetic interference, electromagnetic coupling, or electrostatic discharge, which results in poor signal transmission quality.

In order to attenuate the crosstalk among the signals transmitted by the signal traces and to maintain the signal integrity, one of the conventional techniques is that the signal traces and the ground traces are arranged to comply with the design rule of ground-signal-signal-ground (G-S-S-G) arrangement. However, as an operating speed of the packaged integrated circuit component becomes higher, the crosstalk between the signals transmitted by any two adjacent signal traces becomes more severe. Even though the aforementioned design rule is implemented to arrange the signal and ground traces, it is hard to achieve an acceptable signal transmission quality during the signal transmission at a high speed.

Another conventional technique is arranging one of the ground traces between any two adjacent ones of the signal traces, i.e., the ground traces and the signal traces are arranged to comply with the design rule of ground-signal-ground (G-S-G) arrangement. Furthermore, one of the wiring layers may be replaced with a conductive ground layer. In this way, the crosstalk can be reduced during the signal transmission, thereby improving the signal transmission quality. However, since the numbers and specifications of the signal traces and ground traces still have to meet specific requirements, if only one wiring layer is used to transmit signals, the circuit board has to be enlarged to increase the layout area for arranging the signal traces and the ground traces.

Another one of the conventional techniques is replacing the two-layered circuit board with a four-layered circuit board. To be more specific, the four-layered circuit board includes not only two outermost wiring layers, but also a conductive ground layer and a conductive power layer. However, the fabrication cost of the four-layered circuit board is relatively higher.

Accordingly, how to provide shielding protection for the signal traces and eliminate the crosstalk among the signals transmitted by the signal traces under a situation where the circuit board is not increased in either size or area is still one of the issues to be solved for a person skilled in this industry, so as to allow the electronic apparatus to transmit signals at a higher speed.

SUMMARY OF THE DISCLOSURE

In response to the above-referenced technical inadequacies, the present disclosure provides a printed circuit board assembly and an electronic apparatus using the same, in which a plurality of signal traces of the printed circuit assembly can be effectively shielded to attenuate signal crosstalk, so as to improve the signal transmission speed of the electronic apparatus.

In one aspect, the present disclosure provides a printed circuit board assembly including a circuit board and a first bridging unit. The circuit board includes a first wiring layer, and the first wiring layer includes a plurality of first ground traces, a plurality of first signal traces, and at least one first ground region. Each of the first signal traces is disposed between one of the first ground traces and the first ground region. The first bridging unit is disposed on the circuit board. The first bridging unit extends over, without contacting, at least one of the first signal traces from one of the first ground traces to another one of the first ground traces or the first ground region so as to form at least one first conductive ground path.

In certain embodiments, the circuit board further includes a second wiring layer, and the first wiring layer and the second wiring layer are respectively disposed at two opposite sides of the circuit board. The second wiring layer includes a plurality of second ground traces, a plurality of second signal traces and at least one second ground region, and each of the second signal traces is disposed between the second ground region and at least one of the second ground traces.

Furthermore, the printed circuit board assembly further includes a second bridging unit located at the same side of the circuit board as the second wiring layer. The second bridging unit extends over at least one of the second signal traces from one of the second ground traces to another one of the second ground traces or the second ground region so as to form a second conductive ground path.

In certain embodiments, the first ground traces partially overlap with the second ground traces in a thickness direction of the circuit board, and the circuit board includes a plurality of conductive ground vias. Each of the conductive ground vias extends from one of the first ground traces to one of the second ground traces.

In certain embodiments, the circuit board has a control device arrangement region and an electronic device arrangement region, and the first ground traces and the first signal traces extend from the control device arrangement region to the electronic device arrangement region.

Furthermore, the first signal traces and the first ground traces are alternately arranged, and the first bridging unit includes a plurality of first conductive elements, and one of the first conductive elements is connected to the first ground region and one of the first ground traces.

In certain embodiments, each of the first conductive element includes at least two pins, the at least two pins of one of the first conductive elements are connected to two of the first ground traces that are closest to each other, respectively. The at least two pins of another one of the first conductive elements are connected to the first ground region and one of the first ground traces that is the closest to the first ground region.

Furthermore, two of the first conductive elements extend over the same one of the first signal traces and are spaced apart from each other by a predetermined distance.

In certain embodiments, the first bridging unit extends over more than one of the first signal traces and includes a connection portion and a plurality of pins protruding from the connection portion. One of the pins is connected to the first ground region, and remaining ones of the pins are respectively connected to the corresponding first ground traces.

In certain embodiments, the first bridging unit is a shielding frame that covers the first signal traces and is connected to the first ground traces. The shielding frame includes a cover plate and a plurality of partition plates protruding from the cover plate, each of the partition plates includes a plurality of contact protrusions located at the bottom end thereof, and each of the contact protrusions is connected to the corresponding one of the first ground traces.

In another aspect, the present disclosure provides an electronic apparatus including a printed circuit board assembly, a control device, and an electronic device. The printed circuit board assembly includes a circuit board and a first bridging unit. The circuit board includes a first wiring layer, and the first wiring layer includes a plurality of first ground traces, a plurality of first signal traces, and at least one first ground region. Each of the first signal traces is disposed between one of the first ground traces and the first ground region. The first bridging unit is disposed on the circuit board. The first bridging unit extends over, without contacting, at least one of the first signal traces from one of the first ground traces to another one of the first ground traces or the first ground region, so as to form at least one first conductive ground path. The control device is disposed on the circuit board, and the electronic device is disposed on the circuit board and electrically connected to the control device.

Furthermore, the first bridging unit is a shielding frame covering the first signal traces, the control device, and the electronic device. The shielding frame is connected to the first ground traces and includes a cover plate and a plurality of partition plates protruding from the cover plate. Each of the partition plates includes a plurality of contact protrusions located at the bottom end thereof, and each of the contact protrusions is connected to a corresponding one of the first ground traces.

Therefore, by virtue of "the first bridging unit being disposed on the first wiring layer of the circuit board" and "the first bridging unit extending over at least one of the first signal traces from one of the first ground traces to another one of the first ground traces or the first ground region," at least one of the first conductive ground path for shielding the at least one of the first signal traces can be established. That is to say, the first conductive ground path intersects with the first ground traces and cooperates with the first ground traces or the first ground region connected thereto in shielding at least one of the first signal traces. As such, the signal traces can be effectively shielded even without increasing the area or size of the circuit board, so that the electronic apparatus can transmit signals at a higher speed.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
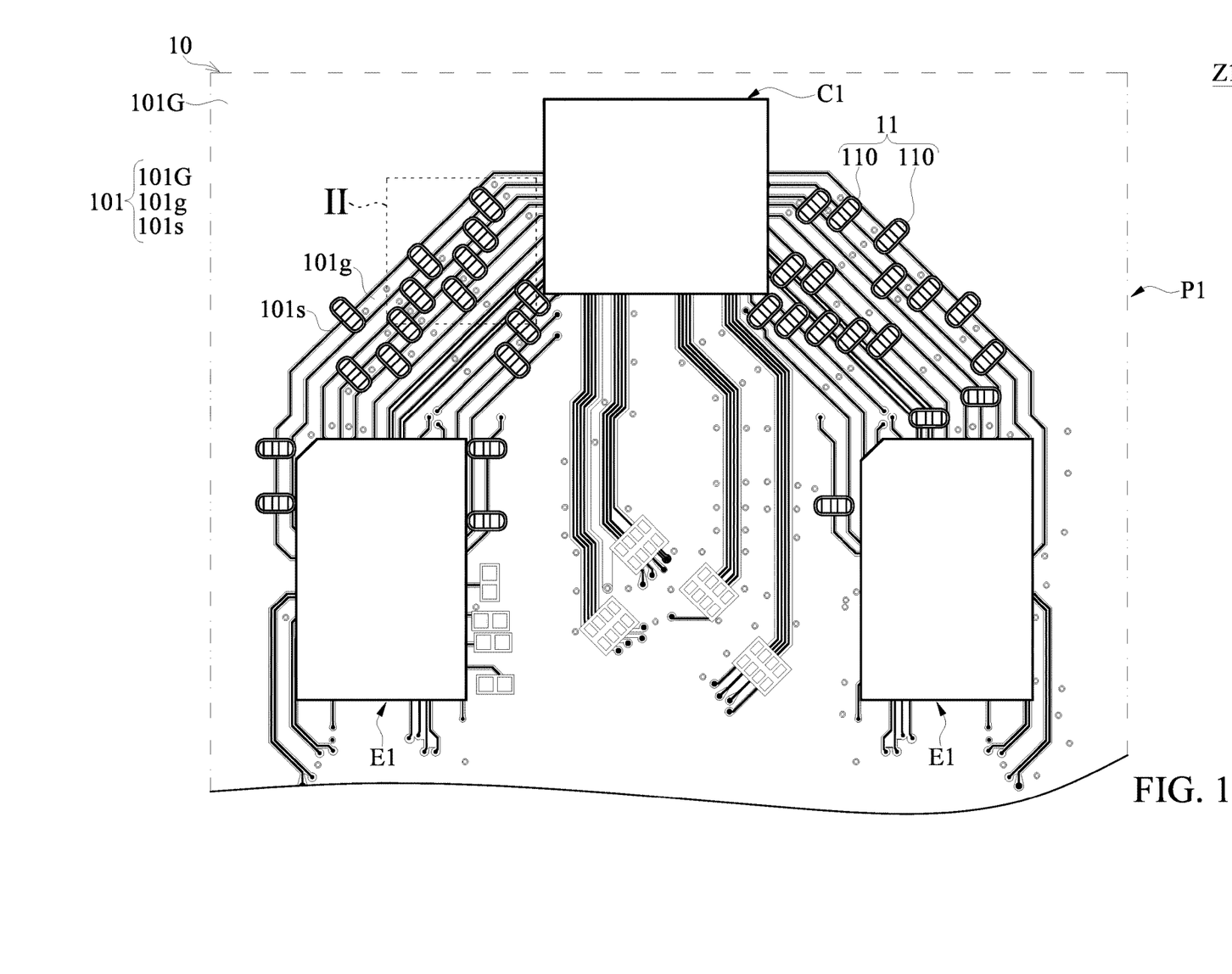
FIG. 1 is a partial top schematic view of an electronic apparatus according to an embodiment of the present disclosure.

Reference is made to FIG. 1, in which FIG. 1 is a partial top schematic view of an electronic apparatus according to an embodiment of the present disclosure. The electronic apparatus Z1 of the embodiment of the present disclosure includes a printed circuit board assembly P1, a control device C1 and an electronic device E1. The control device C1 is, for example, a central processing unit (CPU), or a graphic processing unit (GPU), which may be a packaged structure of a system on chip (SoC). Furthermore, the control device C1 of the embodiment of the present disclosure is suitable for transmitting signals at a high speed, such as at a speed of higher than 1800 MHz.

The electronic device E1 is, for example, a memory, a passive device, or a discrete device, and so on, and the present disclosure is not limited to the examples provided herein. The memory may be a dynamic random access memory (DRAM) or a flash memory. The passive device may be a resistor, a capacitor, or an inductor, and the discrete device may be a transistor or a diode, but the present disclosure is not limited thereto. As shown in FIG. 1, two electronic devices E1 are illustrated to be exemplified, but the number and types of the electronic device E1 are not limited. In other embodiments, there may be only one electronic device E1.

As shown in FIG. 1, the control device C1 and the electronic devices E1 are disposed on the printed circuit board assembly P1, and are electrically connected to one another through the printed circuit board assembly P1. That is to say, the signals can be transmitted between the control device C1 and each electronic device E1. In one embodiment, the signals are transmitted between the control device C1 and each of the electronic devices E1 at a relatively high speed, such as at a speed of more than 1800 MHz. Accordingly, when the control device C1 transmits the signals at a higher speed, the printed circuit board assembly P1 provided in the embodiment of the present disclosure can be used to attenuate the signal crosstalk.

Figure 2:
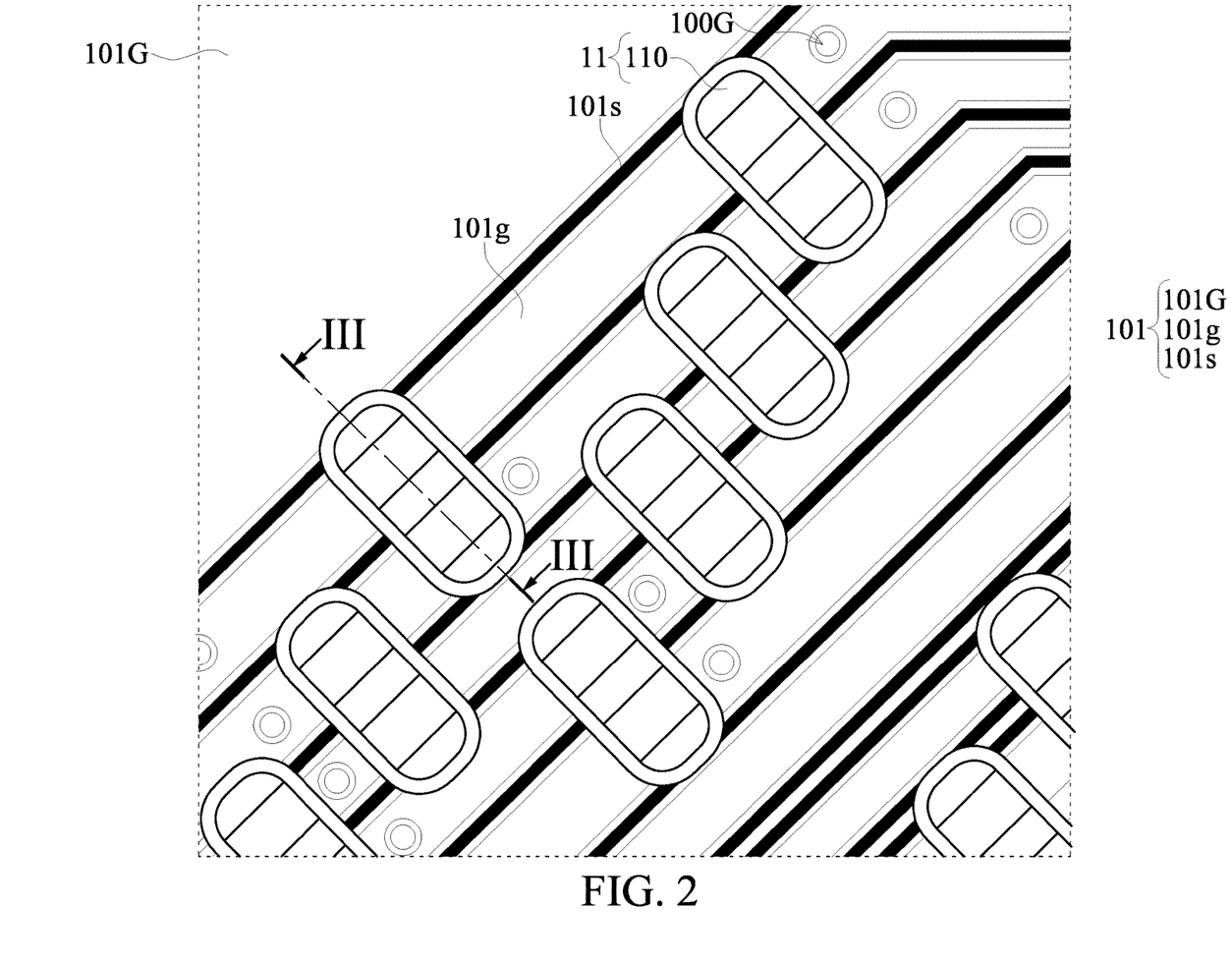
FIG. 2 shows an enlarged view of part II of FIG. 1.
Figure 3:
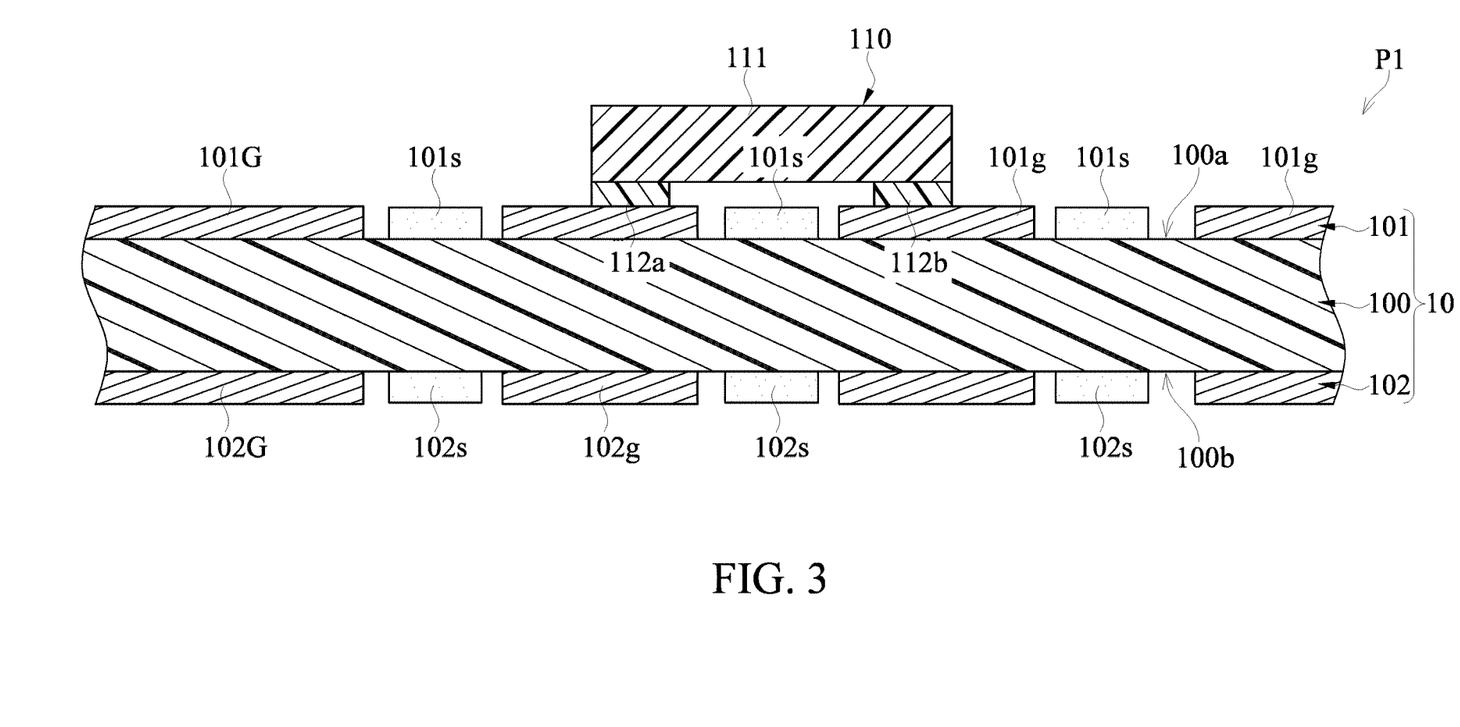
FIG. 3 is a cross-sectional view taken along line III-III of FIG. 2.

Reference is made to FIG. 1 to FIG. 3, in which FIG. 2 shows an enlarged view of part II of FIG. 1, and FIG. 3 is a cross-sectional view taken along line III-III of FIG. 2. The printed circuit board assembly P1 of the embodiment of the present disclosure includes a circuit board 10 and a first bridging unit 11.

The circuit board 10 includes a first wiring layer 101, and the first wiring layer 101 includes a plurality of first ground traces 101g, a plurality of first signal traces 101s, and at least a first ground region 101G. In the embodiment, the control device C1 and the electronic device E1 are disposed on the first wiring layer 101 and are electrically connected to each other through the first wiring layer 101.

As shown in FIG. 1, the circuit board 10 has a control device arrangement region (not labeled) and at least one electronic device arrangement region (not labeled). The circuit board 10 also has a plurality of pads (not shown in FIG. 1) disposed in the control device arrangement region, and a plurality of pads (not shown in FIG. 1) disposed in the electronic device arrangement region. The first ground traces 101g and the first signal traces 101s extend from the control device arrangement region to the at least one electronic device arrangement region.

The first signal traces 101s and the first ground traces 101g respectively extend from the pads (not shown in FIG. 1) under the control device C1 to the pads (not shown in FIG. 1) under each of the electronic devices E1. When the control device C1 is disposed in the control device arrangement region, and the electronic device E1 is disposed in the at least one electronic device arrangement region, the control device C1 and the electronic device E1 can transmit signals therebetween through the first signal traces 101s.

Reference is made to FIG. 1, in which each of the first signal traces 101s is arranged between one of the first ground traces 101g and the first ground region 101E In the region shown in FIG. 2, the first signal traces 101s and the first ground traces 101g are arranged alternately. That is to say, each of the first signal traces 101s is immediately adjacent to at least one of the first ground traces 101g or immediately adjacent to the first ground region 101G. When the signals are transmitted through the first signal traces 101s, each of the first ground traces 101g can shield the adjacent first signal trace 101s so as to attenuate the signal crosstalk.

However, the arrangements of the first signal traces 101s and the first ground traces 101g can be determined according to actual implementations, and are not limited in the present disclosure. In other embodiments or in another region of the circuit board 10, two or more first signal traces 101s may be disposed between two of the first ground traces 101g that are closest to each other.

Compared to each of the first ground traces 101g, the first ground region 101G has a larger area. Most of the first ground traces 101g are also connected to the first ground region 101E During the signal transmission between the control device C1 and the electronic device E1, the noise generated from one of the first signal traces 101s and then coupled to the closest first ground trace 101g due to a coupling effect would be transmitted to the first ground region 101G, and be eliminated.

However, compared to one of the first ground traces 101g that is closer to the first ground region 101G, another one of the first ground traces 101g that is farther away from the first ground region 101G forms a relatively longer ground path. As such, the noise on the first ground trace 101g that is farther away from the first ground region 101G cannot be transmitted to the first ground region 101G to be eliminated within a short period of time, instead, the noise would continue to interfere with the signal transmission of the first signal traces 101s. As the operating speed of the control device C1 becomes higher, the noise on the first ground trace 101g, which is farther away from the first ground region 1016, results in a more significant negative impact on the signal transmission quality. The operating speed of the control device C1 may not be improved since the noise cannot be rapidly eliminated.

Reference is made to FIG. 2, which is to be read in conjunction with FIG. 3. It should be noted that in the embodiment of the present disclosure, the circuit board 10 further includes a second wiring layer 102, and the first and second wiring layers 101, 102 are spaced apart from each other by an insulating layer 100. Specifically, the insulating layer 100 has a first surface 100a and a second surface 100b opposite to the first surface 100a, and the first and second wiring layers 101, 102 are disposed on the first and second surfaces 100a, 100b, respectively. That is to say, the first and second wiring layers 101, 102 are respectively located at two opposite sides of the circuit board 10. Similar to the first wiring layer 101, the second wiring layer 102 also includes a plurality of second ground traces 102g, a plurality of second signal traces 102s, and at least one second ground region 102G.

Referring to FIG. 3 in the instant embodiment, the first ground traces 101g and the second ground traces 102g partially overlap with each other in a thickness direction of the circuit board 10. Furthermore, as shown in FIG. 2, the circuit board 10 further includes a plurality of conductive ground vias 100G, and each of the conductive ground vias 100G extends from one of the first ground traces 101g to one of the second ground traces 102g.

It should be noted that since neither the first wiring layer 101 nor the second wiring layer 102 is a continuous ground plane, the noise on the first and second ground traces 101g, 102g may not be rapidly transmitted to the continuous ground plane during the operation of the control device C1. Specifically, the noise on some of the first ground traces 101g may need to be transmitted to the second ground traces 102g through the conductive ground vias 100G, and then be transmitted to the second ground region 102G. In other words, if a ground path is too long, the noise will always remain on the first or second ground traces 101g, 102g, and the noise cannot be eliminated immediately, such that the operation frequency of the control device C1 cannot be increased. The higher the operating speed of the control device C1 becomes, the more difficult it is for the noise to be eliminated immediately, which may result in more severe signal crosstalk.

Accordingly, in the embodiment of the present disclosure, the printed circuit board assembly P1 includes at least one first bridging unit 11 to form at least one first conductive ground path that intersects with the first ground traces 101g. To be more specific, as shown in FIG. 2, the first bridging unit 11 is disposed on the first wiring layer 101 of the circuit board 10, and the first bridging unit 11 extends over, without contacting, at least one of the first signal traces 101s from one of the first ground traces 101g to another one of the first ground traces 101g or the first ground region 101G so as to form the at least one first conductive ground path. The first conductive ground path and one of the first ground traces 101g may be perpendicular to each other or form an acute angle therebetween, thus being non-parallel to each other.

Referring to FIG. 2 in the instant embodiment, the first bridging unit 11 includes a plurality of first conductive elements 110. Reference is made to FIG. 3, in which each of the first conductive elements 110 can be a zero-ohm resistor and includes a connection portion 111 and two pins 112a, 112b protruding from the connection portion 111. One of the first conductive elements 110 is connected to two of the first ground traces 101g that are closest to each other through the two pins 112a, 112b, and extends over at least one of the first signal traces 101s. The first conductive element 110 can also be an inductor, a ferrite bead, or another element capable of forming a short circuit, and the present disclosure is not limited thereto.

The positions and number of the first conductive elements 110 can be determined based on a simulation result of the signal transmission. For example, if, according to the simulation result, one of the first signal traces 101s (e.g., the first signal trace 101s that is the second closest to the first ground region 101G shown in FIG. 3) has a poor signal transmission quality, at least one of the first conductive elements 110 can be connected to two of the first ground traces 101g that are adjacent to the first signal trace 101s with the poor signal transmission quality, so as to be disposed above the aforementioned first signal trace 101s to improve the signal transmission quality thereof.

If, according to the simulation result, one of the first signal traces 101s has a very poorer signal transmission quality, more than one first conductive element 110 can be used to shield the same one of the first signal traces 101s so as to provide a better shielding effect. That is to say, two of the first conductive elements 110 can be disposed above the same one of the first signal traces 101s and be spaced apart from each other by a predetermined distance. The aforementioned predetermined distance can be adjusted according to actual requirements, and is not limited in the present disclosure.

Furthermore, as shown in FIG. 2, in one embodiment, the first conductive element 110 can extend over one of the first signal traces 101s that is closest to the first ground region 101G from the first ground region 101G and one of the first ground traces 101g that is closest to the first ground region 101E It is worth mentioning that the positions of the first conductive elements 110 can be arranged to avoid the positions of the conductive ground vias 100G.

In the embodiment of the present disclosure, the first conductive elements 110 respectively extend over the corresponding first signal traces 101s to form a plurality of first conductive ground paths. As such, the noise on the first ground trace 101g that is farther away from the first ground region 101G can be rapidly transmitted to the first ground region 101G through the first conductive ground paths and be eliminated.

To be more specific, the first conductive ground paths established by the first conductive elements 110 intersect with the extension directions of the first ground traces 101g, and form a ground mesh. The ground mesh provides shortest paths for the noise to be transmitted from any one of the first ground traces 101g to the first ground region 1016, and shields the first signal traces 101s, thereby improving the signal transmission quality.

As mentioned above, in the electronic apparatus Z1 of the embodiment of the present disclosure, by disposing the first bridging unit 11 on the first wiring layer 101, the first signal traces 101s can be more effectively shielded even through the area or the size of the circuit board 10 is not increased, and the signal transmission quality can be improved. As such, under a situation where the operating speed (or operating frequency) of the control device C1 is increased, the signal transmission quality can be prevented from being compromised since the number of the first conductive ground paths has been increased. In other words, the arrangement of the first bridging unit 11 allows the operating speed (or the operating frequency) of the control device C1 to be further increased.

Figure 4:
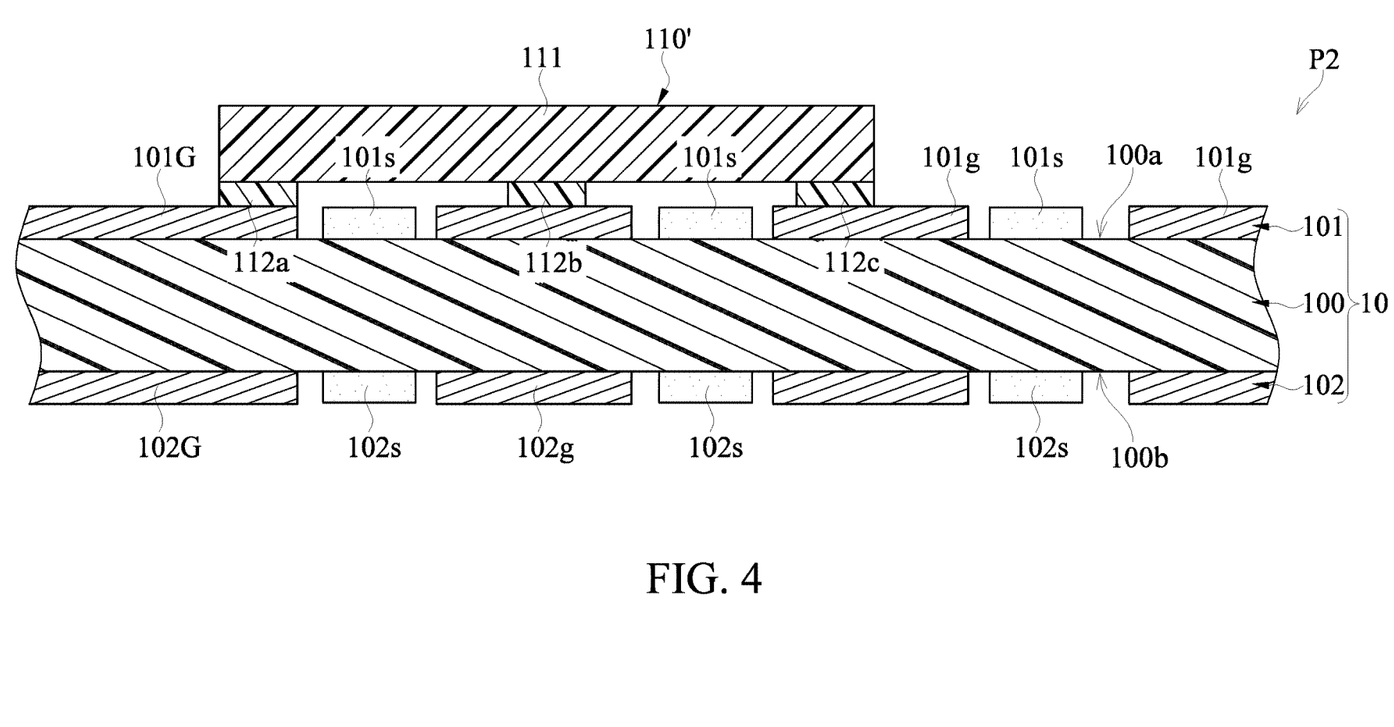
FIG. 4 is a partial cross-sectional view of a printed circuit board assembly according to another embodiment of the present disclosure.

However, as long as the first conductive ground paths that intersect with the first ground traces 101g can be formed, the structure of the first conductive element 110 is not limited to the example provided herein. Reference is made to FIG. 4, which is a partial cross-sectional view of a printed circuit board assembly according to another embodiment of the present disclosure. The elements of the printed circuit board assembly P2 of the instant embodiment which are similar to or the same as those shown in FIG. 3 are denoted by similar or the same reference numerals, and will not be reiterated herein. The first conductive element 110' of the instant embodiment extends over more than one first signal trace 101s. As shown in FIG. 4, the first conductive element 110' extends over two of the first signal traces 101s from one of the first ground traces 101g to another one of the first ground traces 101g.

To be more specific, the first conductive element 110' includes a connection portion 111 and a plurality of pins 112a-112c protruding from the connection portion 111. In the embodiment shown in FIG. 4, one of the pins 112a is connected to the first ground region 101G, and the other pins 112b, 112c are respectively connected to the corresponding first ground traces 101g. In this way, the first conductive element 110' can not only be electrically connected to more of the first ground traces 101g, but also shield more of the first signal traces 101s.

Figure 5:
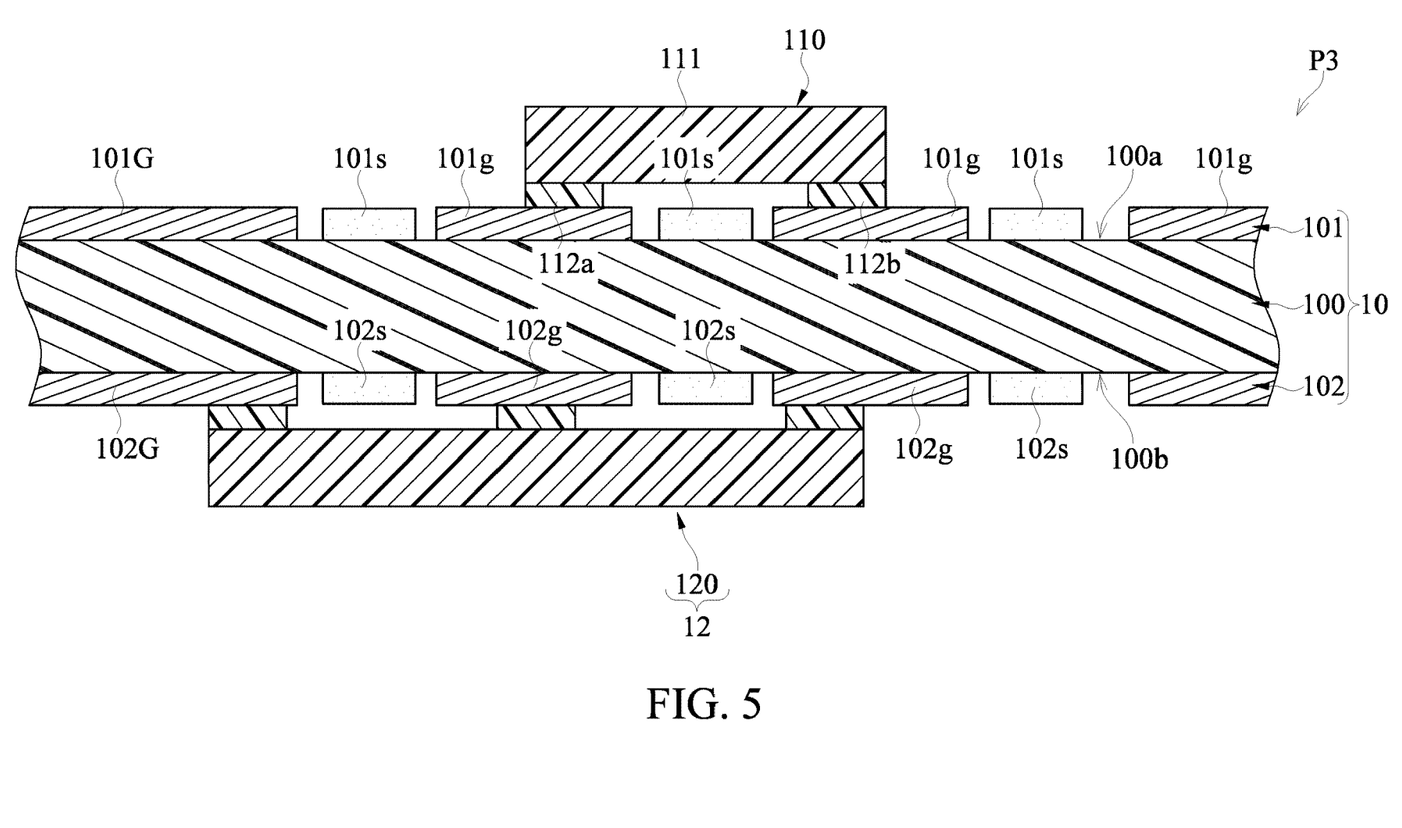
FIG. 5 is a partial cross-sectional view of a printed circuit board assembly according to another embodiment of the present disclosure.

Reference is made to FIG. 5, which is a partial cross-sectional view of a printed circuit board assembly according to another embodiment of the present disclosure. The elements of the printed circuit board assembly P3 of the instant embodiment which are similar to or the same as those shown in FIG. 3 are denoted by similar or the same reference numerals, and will not be reiterated herein. The printed circuit board assembly P3 of the embodiment of the present disclosure further includes a second bridging unit 12. The second bridging unit 12 and the second wiring layer 102 are located at the same side of the circuit board 10, and the second bridging unit 12 is disposed on the wiring layer 102. The second bridging unit 12 extends over at least one of the second signal traces 102s from one of the second ground traces 102g to another one of the second ground traces 102g or the second ground region 102G so as to form at least one second conductive ground path.

In one embodiment, the second bridging unit 12 can also include a plurality of second conductive elements 120 (only one is shown in FIG. 5 as an example) so as to form a plurality of second conductive ground paths. The second conductive element 120 can have the same structure as that of the first conductive element 110 or 110' shown in FIG. 3 or FIG. 4. Furthermore, the second conductive ground paths intersect with the extension directions of the second ground traces 102g, so that the noise on the second ground traces 102g can be rapidly transmitted to the second ground region 102G and be eliminated.

That is to say, in the instant embodiment, the first bridging unit 11 and the second bridging unit 12 of the printed circuit board assembly P3 are respectively located at two opposite sides of the circuit board 10 and can shield the corresponding first signal traces 101s and the corresponding second signal traces 102s, respectively. Accordingly, by respectively arranging the first and second bridging units 11, 12 at the two opposite sides of the circuit board 10, the signal transmission quality can be further improved.

It should be noted that compared to a conventional circuit board, as long as at least one of the first and second bridging units 11, 12 is included in the printed circuit board assembly P1, P2, or P3 of the electronic apparatus Z1, the signal transmission quality can be improved, which allows the signal transmission speed to be further increased. In other words, in addition to the embodiments shown in FIG. 3 to FIG. 5, in another embodiment, only the second bridging unit 12 can be included in the printed circuit board assembly, and the second bridging unit 12 and the control device C1 can be located at the two opposite sides of the circuit board 10, respectively.

Figure 6:
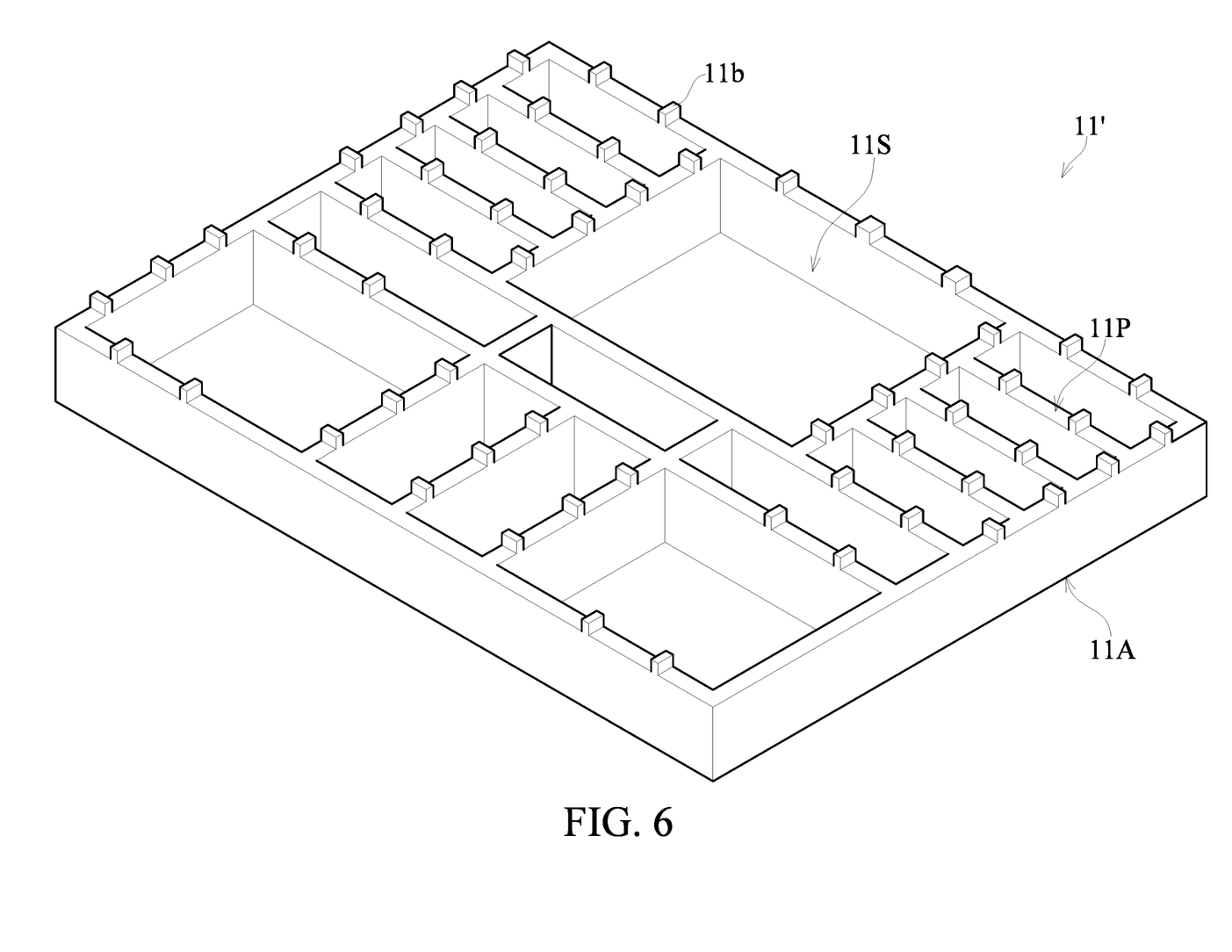
FIG. 6 is a perspective view of a first bridging unit according to another embodiment of the present disclosure.

Reference is made to FIG. 1 to FIG. 6, in which FIG. 6 is an exploded view of a first bridging unit according to another embodiment of the present disclosure. In the instant embodiment, the first bridging unit 11' is a shielding frame. Specifically, the shielding frame includes a cover plate 11A and a plurality of partition plates 11P protruding from the cover plate 11A. In the instant embodiment, the partition plates 11P can define a plurality of accommodating spaces 11S for accommodating the control device C1 and the electronic device(s) E1, respectively. Furthermore, each of the partition plates 11P includes a plurality of contact protrusions 11b located at the bottom end thereof.

Figure 7:
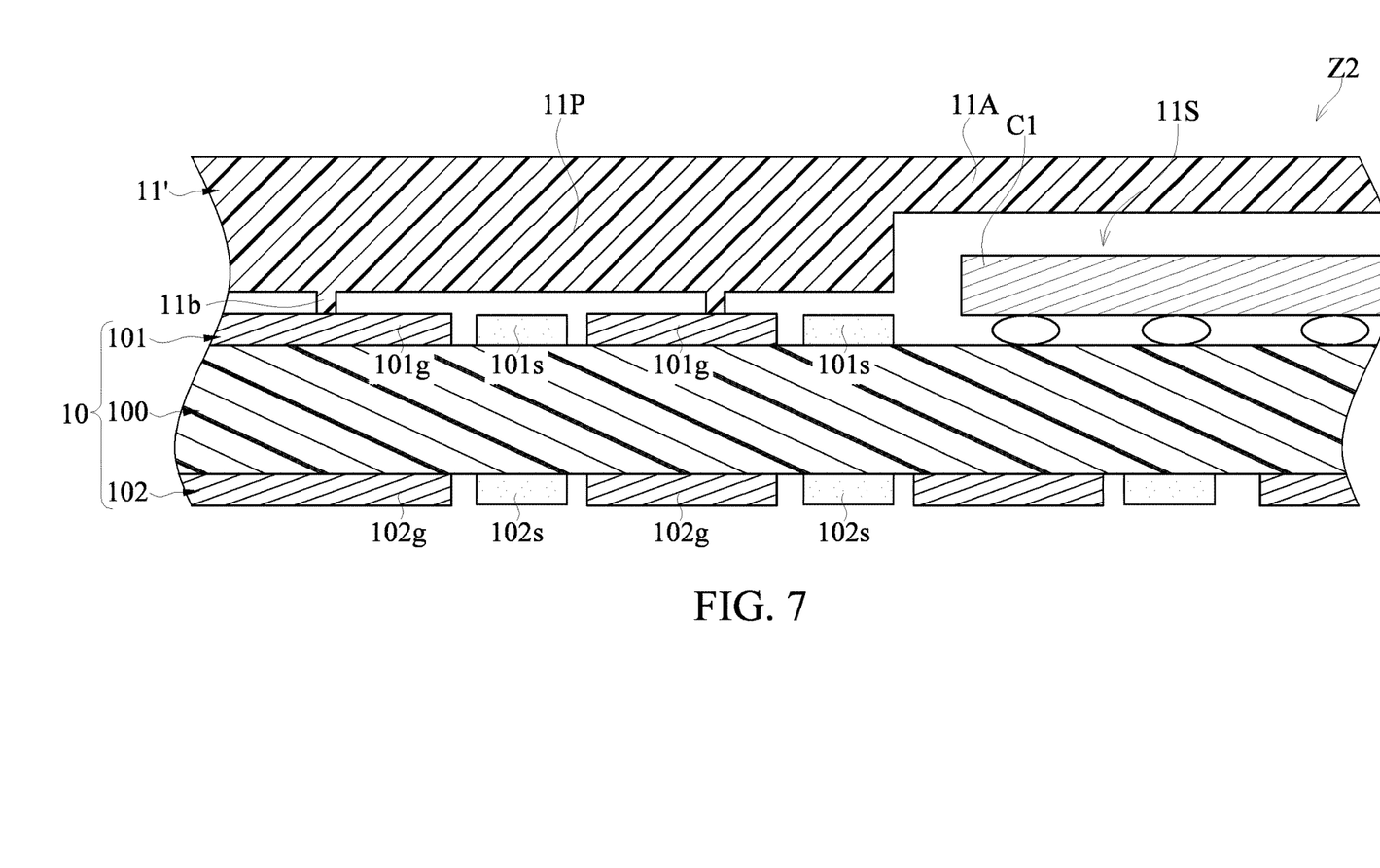
FIG. 7 is a partial cross-sectional view of an electronic apparatus according to another embodiment of the present disclosure.

Reference is made to FIG. 7, which is a partial cross-sectional view of an electronic apparatus according to another embodiment of the present disclosure. The elements of the electronic apparatus Z2 of the instant embodiment which are similar to or the same as those of the electronic apparatus Z1 shown in FIG. 1 are denoted by similar or the same reference numerals, and will not be reiterated herein.

In the instant embodiment, the control device C1 and the electronic device E1 are disposed on the circuit board 10. For ease of description, only a part of the control device C1 is illustrated in FIG. 7 to be exemplified. When the shielding frame (i.e., the first bridging unit 11') is disposed on the circuit board 10, the partition plates 11P face toward the first wiring layer 101 of the circuit board 10, and the accommodating spaces 11S of the shielding frame are respectively in alignment with the control device C1 and the electronic device(s) E1 so as to prevent the partition plates 11P from being interfered with the control device C1 and the electronic device(s) E1.

Accordingly, the shielding frame (the first bridging unit 11') covers all of the first signal traces 101s, the control device C1, and the electronic device(s) E1, and is connected to the first ground traces 101g. To be more specific, as shown in FIG. 6 and FIG. 7, each of the partition plates 11P has a plurality of contact protrusions 11b located at the bottom end thereof, and each of the contact protrusions 11b is connected to the first ground region 101G or the corresponding one of the first ground traces 101g, but is not connected to any one of the first signal traces 101s. In one embodiment, the protrusion contacts 11b can be physically connected to the same one of the first ground traces 101g. When the shielding frame is disposed on the first wiring layer 101, each of the partition plates 11P extends over and is disposed above one or more of the corresponding first signal traces 101s.

Accordingly, during the operation of the electronic apparatus Z2, the shielding frame can function as a continuous or complete ground plane, so that the noise on the first ground traces 101g can be rapidly transmitted to the shielding frame and be eliminated. Furthermore, the shielding frame can shield the control device C1 and the electronic device(s) E1 (which is not shown in FIG. 7) to prevent the operations of the control device C1 and the electronic device(s) E1 from being affected by electromagnetic interference or electrostatic discharge.

In one embodiment, the electronic apparatus Z2 further includes a second bridging unit 12 disposed on the second wiring layer 102, and the second bridging unit 12 can also be a shielding frame. It should be noted that under a situation where neither the control device C1 nor the electronic device(s) E1 is disposed on the second wiring layer 102, it is not necessary for the second bridging unit 12 (the shielding frame) to define any accommodating space.

In conclusion, one of the advantages of the present disclosure is that in the printed circuit board assembly and the electronic apparatus using the same provided herein, by virtue of "disposing the bridging unit (at least one of the first and second bridging units 11, 12) on the wiring layer (the first or second wiring layers 101, 102) of the circuit board 10" and "the bridging unit extending over at least one of the signal traces (the first or second signal traces 101s, 102s) from one of the ground traces (the first or second ground traces 101g, 102g) to another one of the ground traces or the ground region (the first or second ground region 1016, 102G)," at least one conductive ground path for assisting to shield at least one of the signal traces can be formed.

Referring to the embodiments shown in the present disclosure, the first conductive ground path (or the second conductive ground path) established by the first bridging unit 11, 11' (or the second bridging unit 12) intersects with one of the first ground traces 101g (or the second ground traces 102g), and cooperates with the first ground traces 101g (or the second ground traces 102g) that are connected thereto to shield at least one of the first signal traces 101s (or the second signal traces 102s). As such, the signal traces can be effectively shielded even without increasing the area or size of the circuit board, thereby increasing the signal transmission speed of the electronic apparatus Z1, Z2.

Based on a simulation result, under the situation where the first bridging unit 11, 11' (or the second bridging unit 12) is not disposed, the maximum transmission speed of the signals transmitted between the control device C1 (such as a system integrated circuit chip) and the electronic device E1 (such as a dynamic random access memory) is limited at 1866 MHz due to the poor signal transmission quality. However, under the situation where the first bridging unit 11, 11' (or the second bridging unit 12) is disposed on the first wiring layer 101 (or the second wiring layer 102), the maximum signal transmission speed of the signals transmitted between the control device C1 (such as a system integrated circuit chip) and the electronic device E1 (such as a dynamic random access memory) can reach 2133 MHz.

That is to say, even though only two wiring layers, instead of four wiring layers, are included in the circuit board of the printed circuit board assembly, the electronic apparatus Z1 or Z2 including the printed circuit board assembly provided in the embodiment of the present disclosure can have similar performances (including the signal transmission quality and speed) to those of the conventional electronic apparatus with a four-layered circuit board. However, compared to the four-layered circuit board, the cost of the printed circuit board assembly provided in the embodiment of the present disclosure is relatively lower.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A printed circuit board assembly, comprising: a circuit board comprising a first wiring layer, wherein the first wiring layer comprises a plurality of first ground traces, a plurality of first signal traces and at least one first ground region, and each of the first signal traces is disposed between one of the first ground traces and the first ground region; and a first bridging unit disposed on the circuit board, wherein the first bridging unit extends over, without contacting, at least one of the first signal traces from one of the first ground traces to another one of the first ground traces or the first ground region, so as to form at least one first conductive ground path, wherein the circuit board further comprises a second wiring layer, and the first wiring layer and the second wiring layer are respectively disposed at two opposite sides of the circuit board; and wherein the second wiring layer comprises a plurality of second ground traces, a plurality of second signal traces and at least one second ground region, and each of the second signal traces is disposed between the second ground region and one of the second ground traces, wherein the first ground traces partially overlap with the second ground traces in a thickness direction of the circuit board, and wherein the circuit board further comprises a plurality of conductive ground vias, and each of the conductive ground vias extends from one of the first ground traces to one of the second ground traces.

2. The printed circuit board assembly according to claim 1, further comprising a second bridging unit located at the same side of the circuit board as the second wiring layer, wherein the second bridging unit extends over at least one of the second signal traces from one of the second ground traces to another one of the second ground traces or the second ground region, so as to form a second conductive ground path.

3. The printed circuit board assembly according to claim 1, wherein the circuit board has a control device arrangement region and an electronic device arrangement region, and the first ground traces and the first signal traces extend from the control device arrangement region to the electronic device arrangement region.

4. The printed circuit board assembly according to claim 1, wherein the first signal traces and the first ground traces are alternately arranged, the first bridging unit comprises a plurality of first conductive elements, and one of the first conductive elements is connected to the first ground region and one of the first ground traces.

5. The printed circuit board assembly according to claim 4, wherein each of the first conductive elements comprises at least two pins, the at least two pins of one of the first conductive elements are connected to two of the first ground traces that are closest to each other, respectively, and the at least two pins of another one of the first conductive elements are connected to the first ground region and one of the first ground traces that is the closest to the first ground region.

6. The printed circuit board assembly according to claim 4, wherein two of the first conductive elements extend over the same one of the first signal traces and are spaced apart from each other by a predetermined distance.

7. The printed circuit board assembly according to claim 1, wherein the first bridging unit extends over more than one of the first signal traces, and comprises a connection portion and a plurality of pins protruding from the connection portion, and wherein one of the pins is connected to the first ground region, and remaining ones of the pins are respectively connected to the corresponding first ground traces.

8. The printed circuit board assembly according to claim 1, wherein the first bridging unit is a shielding frame that covers the first signal traces and is connected to the first ground traces, wherein the shielding frame comprises a cover plate and a plurality of partition plates protruding from the cover plate, each of the partition plates comprises a plurality of contact protrusions located at a bottom end thereof, and each of the contact protrusions is connected to the corresponding one of the first ground traces.

9. An electronic apparatus comprising: a printed circuit board assembly including: a circuit board including a first wiring layer, wherein the first wiring layer includes a plurality of first ground traces, a plurality of first signal traces, and at least one first ground region, each of the first signal traces is disposed between one of the first ground traces and the first ground region; and a first bridging unit disposed on the circuit board, wherein the first bridging unit extends over, without contacting, at least one of the first signal traces from one of the first ground traces to another one of the first ground traces or the first ground region, so as to form at least one first conductive ground path; a control device disposed on the circuit board; and an electronic device disposed on the circuit board and electrically connected to the control device, wherein the circuit board further includes a second wiring layer, and the first wiring layer and the second wiring layer are respectively disposed at two opposite sides of the circuit board; wherein the second wiring layer includes a plurality of second ground traces, a plurality of second signal traces and at least one second ground region, and each of the second signal traces is disposed between the second ground region and one of the second ground trace, wherein the first ground traces partially overlap with the second ground traces in a thickness direction of the circuit board, and wherein the circuit board further includes a plurality of conductive ground vias, and each of the conductive ground vias extends from one of the first ground traces to one of the second ground traces.

10. The electronic apparatus according to claim 9, wherein the printed circuit board assembly further includes a second bridging unit located at a same side of the circuit board as the second wiring layer, wherein the second bridging unit extends over at least one of the second signal traces from one of the second ground traces to another one of the second ground traces or the second ground region, so as to form a second conductive ground path.

11. The electronic apparatus according to claim 9, wherein the first signal traces and the first ground traces are alternately arranged, the first bridging unit includes a plurality of first conductive elements, and one of the first conductive elements is connected to the first ground region and one of the first ground traces.

12. The electronic apparatus according to claim 11, wherein each of the first conductive elements includes at least two pins, the at least two pins of one of the first conductive elements are connected to two of the first ground traces that are closest to each other, respectively, and the at least two pins of another one of the first conductive elements are connected to the first ground region and one of the first ground traces that is the closest to the first ground region.

13. The electronic apparatus according to claim 11, wherein two of the first conductive elements extend over the same one of the first signal traces and are spaced apart from each other by a predetermined distance.

14. The electronic apparatus according to claim 9, wherein the first bridging unit extends over more than one of the first signal traces, and includes a connection portion and a plurality of pins protruding from the connection portion, and wherein one of the pins is connected to the first ground region, and remaining ones of the pins are respectively connected to the corresponding first ground traces.

15. The electronic apparatus according to claim 9, wherein the first bridging unit is a shielding frame that covers the first signal traces, the control device, and the electronic device, and the shielding frame is connected to the first ground traces;

wherein the shielding frame includes a cover plate and a plurality of partition plates protruding from the cover plate, each of the partition plates includes a plurality of contact protrusions located at a bottom end thereof, and each of the contact protrusions is connected to a corresponding one of the first ground traces.

* * * * *